United States Patent
Huang et al.

(10) Patent No.: US 9,947,674 B2
(45) Date of Patent: Apr. 17, 2018

(54) STATIC RANDOM-ACCESS MEMORY (SRAM) CELL ARRAY

(71) Applicant: UNITED MICROELECTRONICS CORP., Hsin-Chu (TW)

(72) Inventors: Chun-Hsien Huang, Tainan (TW); Yu-Tse Kuo, Tainan (TW); Shu-Ru Wang, Taichung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/686,169

(22) Filed: Aug. 25, 2017

(65) Prior Publication Data
US 2017/0373073 A1 Dec. 28, 2017

Related U.S. Application Data

(60) Continuation of application No. 15/635,165, filed on Jun. 27, 2017, which is a division of application No. 15/185,043, filed on Jun. 17, 2016, now Pat. No. 9,728,541.

(30) Foreign Application Priority Data

Apr. 27, 2016 (TW) .............................. 105113038 A

(51) Int. Cl.
*H01L 27/11* (2006.01)
*H01L 29/66* (2006.01)
*H01L 29/78* (2006.01)

(52) U.S. Cl.
CPC ...... *H01L 27/1108* (2013.01); *H01L 27/1116* (2013.01); *H01L 29/6681* (2013.01); *H01L 29/785* (2013.01)

(58) Field of Classification Search
None
See application file for complete search history.

(56) References Cited

U.S. PATENT DOCUMENTS

| 9,012,287 B2 | 4/2015 | Liaw |
| 9,257,439 B2 | 2/2016 | Liaw |
| 9,728,541 B1* | 8/2017 | Huang ................ H01L 27/1108 |
| 2015/0206890 A1 | 7/2015 | Liaw |

OTHER PUBLICATIONS

Kang, Comparative Analysis of 1:1:2 and 1:2:2 FinFET SRAM Bit-Cell Using Assist Circuit,2013.

* cited by examiner

*Primary Examiner* — Jack Chen
(74) *Attorney, Agent, or Firm* — Winston Hsu

(57) ABSTRACT

A static random-access memory (SRAM) cell array forming method includes the following steps. A plurality of fin structures are formed on a substrate, wherein the fin structures include a plurality of active fins and a plurality of dummy fins, each PG (pass-gate) FinFET shares at least one of the active fins with a PD (pull-down) FinFET, and at least one dummy fin is disposed between the two active fins having two adjacent pull-up FinFETs thereover in a static random-access memory cell. At least a part of the dummy fins are removed. The present invention also provides a static random-access memory (SRAM) cell array formed by said method.

8 Claims, 5 Drawing Sheets

STATIC RANDOM-ACCESS MEMORY (SRAM) CELL ARRAY

CROSS REFERENCE TO RELATED APPLICATIONS

This patent application is a continuation application of and claims the benefit of U.S. patent application Ser. No. 15/635,165, filed Jun. 27, 2017, which is a divisional application of and claims priority to U.S. patent application Ser. No. 15/185,043, filed on Jun. 17, 2016, and entitled "STATIC RANDOM-ACCESS MEMORY (SRAM) CELL ARRAY AND FORMING METHOD THEREOF", the entire contents of which are incorporated herein by reference.

BACKGROUND OF THE INVENTION

1. Field of the Invention

The present invention relates generally to a static random-access memory (SRAM) cell array and forming method thereof, and more specifically to a SRAM cell array applying dummy fins and forming method thereof.

2. Description of the Prior Art

Random access memory (RAM) can be operated to read data from it and write data into it. As the computers turn off, data disappears immediately. Since data in RAM can be altered easily, RAM is widely used as temporary data storage memory in personal computers. RAM can be classified into dynamic-type and static-type.

A dynamic random access memory (DRAM: Dynamic RAM) stores one-bit data by one transistor paired with one capacitor, and electricity must be supported during operating to keep this data, thus called Dynamic RAM. Dynamic RAM is a simple structure, therefore having slow access speed and costing low. Thus, it is often used as a memory providing high capacity but low speed such as a main memory of a personal computer.

A static random access memory (SRAM: Static RAM) stores one-bit data by six transistors, and electricity is not needed during operating to keep this data, thus called Static RAM. Static RAM is a complex structure, therefore having high access speed and costing high, thereby it is often used as a memory providing low capacity but high speed such as a 256 KB or 512 KB cache memory built-in a central processing unit (CPU) of a personal computer. Since a CPU mainly affects data calculating and processing speed of a computer while a main memory mainly affects data storage capacity, a cache memory is utilized to save often-used data, thereby the CPU can more quickly reach this often-used data stored in the cache memory, without reaching it in the main memory.

SUMMARY OF THE INVENTION

The present invention provides a static random-access memory (SRAM) cell array and forming method thereof, which improves processing reliability and enhances performance of the static random-access memory cell array.

The present invention provides a method of forming a static random-access memory (SRAM) cell array including the following steps. A plurality of fin structures are formed on a substrate, wherein the fin structures include a plurality of active fins and a plurality of dummy fins, each pass-gate FinFET (PG FinFET) shares at least one of the active fins with a corresponding pull-down FinFET (PD FinFET), at least of the dummy fin is disposed between the two active fins having two adjacent pull-up FinFETs thereover in a static random-access memory cell. At least a portion of the dummy fins are removed.

The present invention provides a static random-access memory (SRAM) cell array including a plurality of fin structures located on a substrate. These fin structures include a plurality of active fins and a plurality of remaining dummy fins shorter than the active fins, wherein each pass-gate FinFET (PG FinFET) shares at least one of the active fins with a corresponding pull-down FinFET (PD FinFET), and at least one of the remaining dummy fins is disposed between the two active fins having two adjacent pull-up FinFETs thereover in a static random-access memory cell.

According to the above, the present invention provides a static random-access memory (SRAM) cell array and forming method thereof, which patterns to form a plurality of fin structures on a substrate, wherein the fin structures include a plurality of active fins and a plurality of dummy fins, and then at least a portion of the dummy fins are removed. Thereby, gaps between these fin structures can be common or approximately common through inserting the dummy fins between some of the active fins. Hence, profiles and shapes of these fin structures can be common or approximately common, which improves device reliability and stability. At least one of the dummy fins is disposed between two of the active fins of two adjacent pull-up FinFETs in a static random-access memory cell. Therefore, the two active fins of two adjacent pull-up FinFETs having larger gaps than the others can be adjusted to have the gaps approximate to the gaps of the others including gaps between fin structures in other areas such as logic areas.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
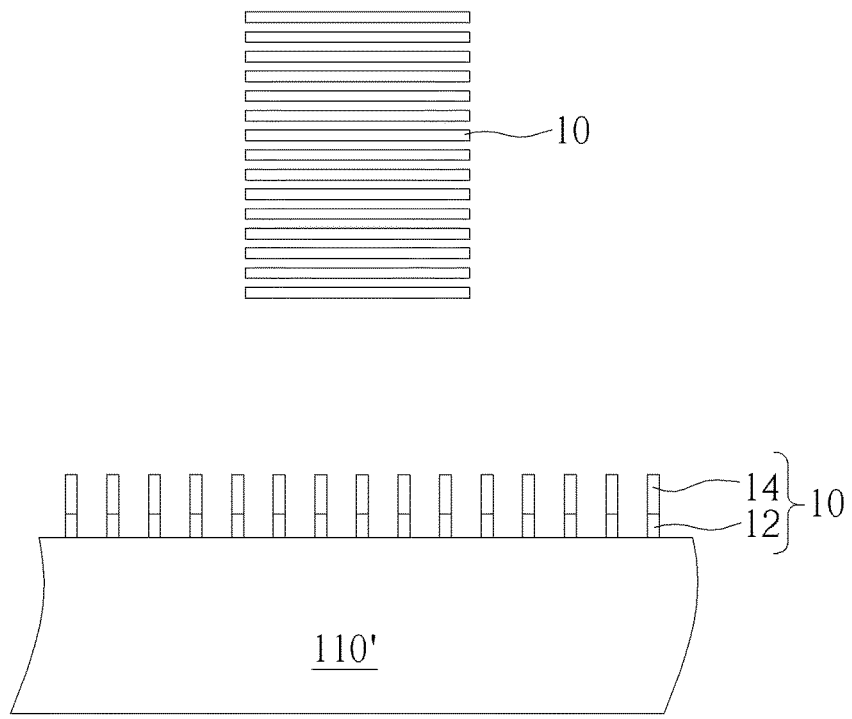
FIG. 1 schematically depict a top view and a cross-sectional view of a method of forming a static random-access memory (SRAM) cell array according to an embodiment of the present invention.
Figure 2:
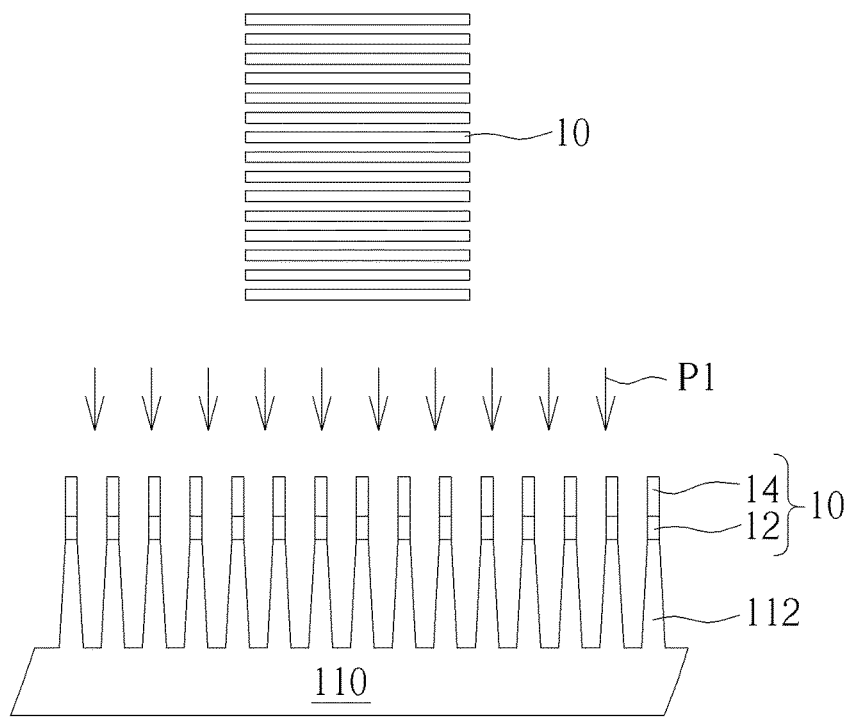
FIG. 2 schematically depict a top view and a cross-sectional view of a method of forming a static random-access memory (SRAM) cell array according to an embodiment of the present invention.

FIGS. 1-7 schematically depict top views and cross-sectional views of a method of forming a static random-access memory (SRAM) cell array according to an embodiment of the present invention. Please refer to FIGS. 1-2, in which a plurality of fin structures 112 are formed on a substrate 110. As shown in FIG. 1, a bulk bottom substrate 110' is provided. A hard mask layer 10 is formed on the bulk bottom substrate 110' and is patterned to define the location of the fin-shaped structures 112, which will be formed in the bulk bottom substrate 110'. In this case, the hard mask layer 10 is an oxide layer 12 and a nitride layer 14 stacked from bottom to top, but it is not limited thereto. As shown in FIG. 2, an etching process P1 is performed to form the fin-shaped structures 112 in the bulk bottom substrate 110'. Thus, the fin-shaped structures 112 located on the substrate 110 are formed completely. In one embodiment, the hard mask layer 10 is removed after the fin-shaped structures 112 are formed, and a tri-gate MOSFET can be formed in the following processes. There are three contact faces between the fin structures 112 and the following formed dielectric layer functioning as a carrier channel whose width is wider than a channel width in a conventional planar MOSFET. When a driving voltage is applied, the tri-gate MOSFET produces a double on-current comparing to the conventional planar MOSFET. In another embodiment, the hard mask layer 10 is preserved to form a fin field effect transistor (Fin FET), which is another kind of multi-gate MOSFET. Due to the hard mask layer 10 being preserved in the fin field effect transistor, there are only two contact faces between the fin structures 112 and the following formed dielectric layer.

The present invention can also be applied to other semiconductor substrates. For example, a silicon-on-insulator substrate (not shown) is provided, and then a single crystalline silicon layer being a top part of the silicon-on-insulator substrate (not shown) is etched till an oxide layer being a middle part of the silicon-on-insulator substrate (not shown) is exposed, meaning the fin-shaped structure formed on the silicon-on-insulator substrate (not shown) is finished. For clarifying the present invention, fifteen fin-shaped structures 112 are depicted in this embodiment, but the present invention can also be applied to a plurality of fin-shaped structures 112 with other numbers.

Figure 3:
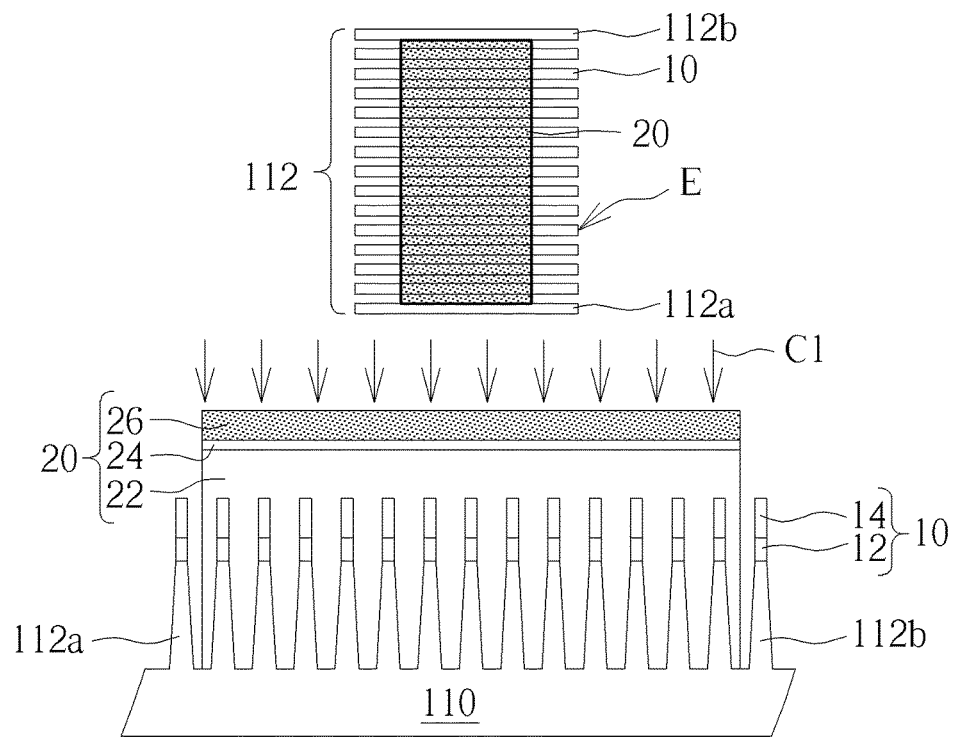
FIG. 3 schematically depict a top view and a cross-sectional view of a method of forming a static random-access memory (SRAM) cell array according to an embodiment of the present invention.
Figure 4:
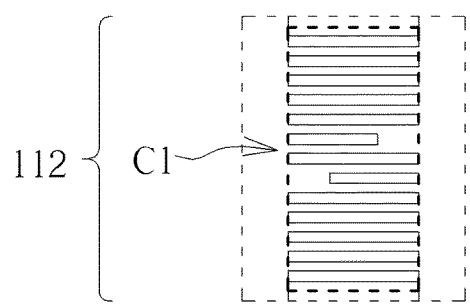
FIG. 4 schematically depict a top view and a cross-sectional view of a method of forming a static random-access memory (SRAM) cell array according to an embodiment of the present invention.
Figure 4:
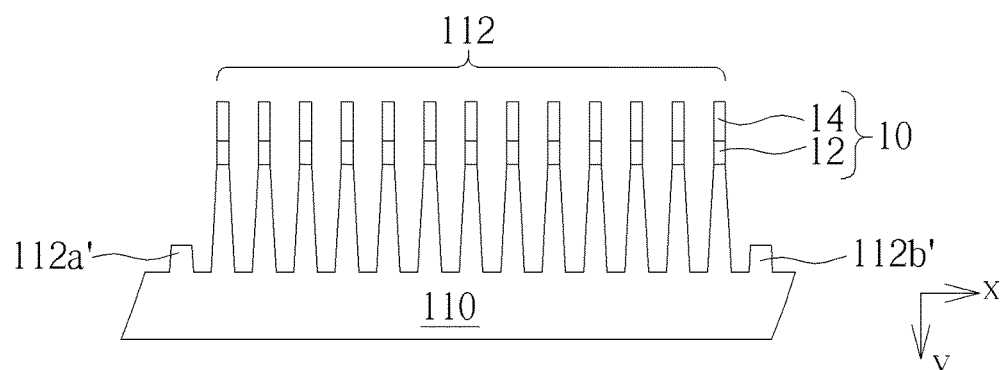
Figure 5:
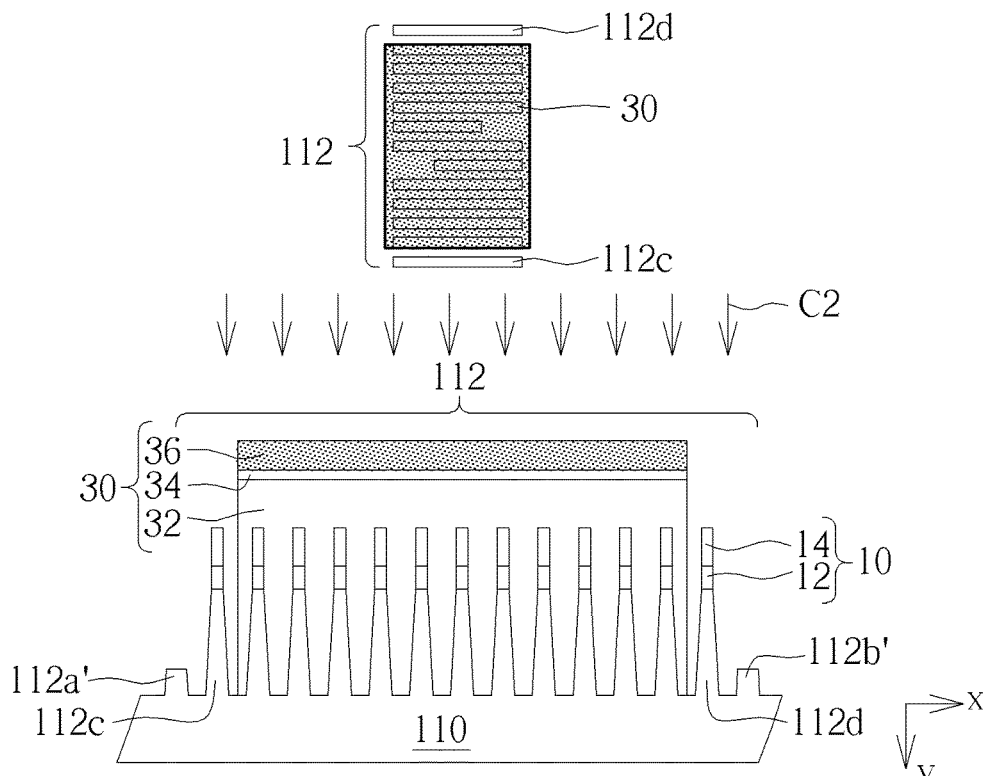
FIG. 5 schematically depict a top view and a cross-sectional view of a method of forming a static random-access memory (SRAM) cell array according to an embodiment of the present invention.
Figure 6:
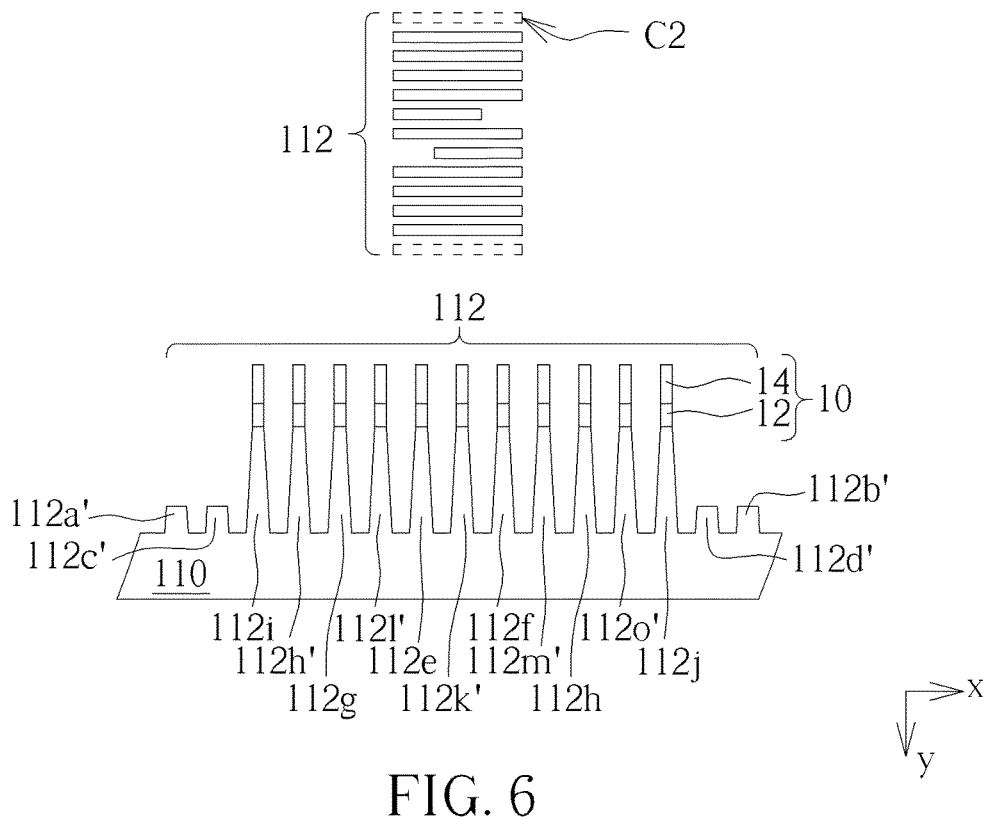
FIG. 6 schematically depict a top view and a cross-sectional view of a method of forming a static random-access memory (SRAM) cell array according to an embodiment of the present invention.

Please refer to FIGS. 3-6, the fin structures 112 are cut off to form a layout of a static random-access memory (SRAM) cell array. Methods of cutting the fin structures 112 and forming the layout of the static random-access memory (SRAM) cell array depend on processing and device requirements. In this case, the method of cutting the fin structures 112 includes a first fin cut C1 and a second fin cut C2, wherein the first fin cut C1 is depicted in FIGS. 3-4 and the second fin cut C2 is depicted in FIGS. 5-6. Methods of forming the fin structures 112 may include sidewall image transfer (SIT) methods. That is, the first fin cut C1 or/and the second fin cut C2 may be steps included in the sidewall image transfer (SIT) methods. Therefore, the first fin cut C1 or/and the second fin cut C2 may include cutting spacers used for transferring patterns to the substrate 110 to form the fin structures 112.

As shown in FIG. 3, a hard mask 20 is formed and patterned to cover a portion of the fin structures 112 not being removed, and expose the other portion of the fin structures 112 being removed. In this case, the hard mask 20 may include an organic dielectric layer (ODL) 22, a silicon-containing hard mask bottom anti-reflection coating (SHB) layer 24 and a photoresist 26 from bottom to top. An edged fin 112a and an edged fin 112b are completely exposed and ends E of the fin structures 112 between the edged fin 112a and the edged fin 112b are exposed by the hard mask 20. Thereby, problems of fin structure connecting and line-end shortening occurring during applying a sidewall image transfer (SIT) method can be solved. Thereafter, the first fin cut C1 is performed to completely remove the edged fin 112a and the edged fin 112b, and the ends E of the fin structures 112 between the edged fin 112a and the edged fin 112b, as shown in FIG. 4, wherein the dashed-part is a cutting range of the first fin cut C1. After the first fin cut C1 is performed, parts 112a'/112b' formed from the edged fin 112a and the edged fin 112b may be preserved, and parts (not shown) formed from the ends E of the fin structures 112 between the edged fin 112a and the edged fin 112b may also be preserved, wherein the parts 112a'/112b' protrude from the substrate 110 between the fin structures 112. The first fin cut C1 may include cutting along many directions or only cutting along one first direction. In this case, the first fin cut C1 cuts along y-direction, and may optionally cut along x-direction to remove the edged fin 112a and the edged fin 112b, but it is not limited thereto. In other cases, the first fin cut C1 may cut only along y-direction, and thus the edged fin 112a and the edged fin 112b are preserved. After the first fin cut C1 is performed, the photoresist 26, the silicon-containing hard mask bottom anti-reflection coating (SHB) layer 24 and the organic dielectric layer (ODL) 22 are removed immediately.

A second fin cut C2 is performed. As shown in FIG. 5, a hard mask 30 is formed and patterned to cover a portion of the fin structures 112 not being removed, and expose the other portion of the fin structures 112 being removed. In this case, the hard mask 30 may include an organic dielectric layer (ODL) 32, a silicon-containing hard mask bottom anti-reflection coating (SHB) layer 34 and a photoresist 36 from bottom to top. An edged fin 112c and an edged fin 112d are completely exposed by the hard mask 30. Thereafter, the second fin cut C2 is performed to remove the edged fin 112c and the edged fin 112d, as shown in FIG. 6, wherein the dashed-part is a cutting range of the second fin cut C2. After the second fin cut C2 is performed, parts 112c'/112d' formed from the edged fin 112c and the edged fin 112d may be preserved, wherein the parts 112c'/112d' protrude from the substrate 110 between the fin structures 112. In this case, the second fin cut C2 cuts along a second direction, meaning x-direction. Thus, the first direction of the first fin cut C1 is orthogonal to the second direction of the second fin cut C2, but it is not limited thereto. After the second fin cut C2 is performed, the photoresist 36, the silicon-containing hard mask bottom anti-reflection coating (SHB) layer 34 and the organic dielectric layer (ODL) 32 are removed immediately. In this embodiment, the hard mask layer 10 is immediately removed.

Figure 7:
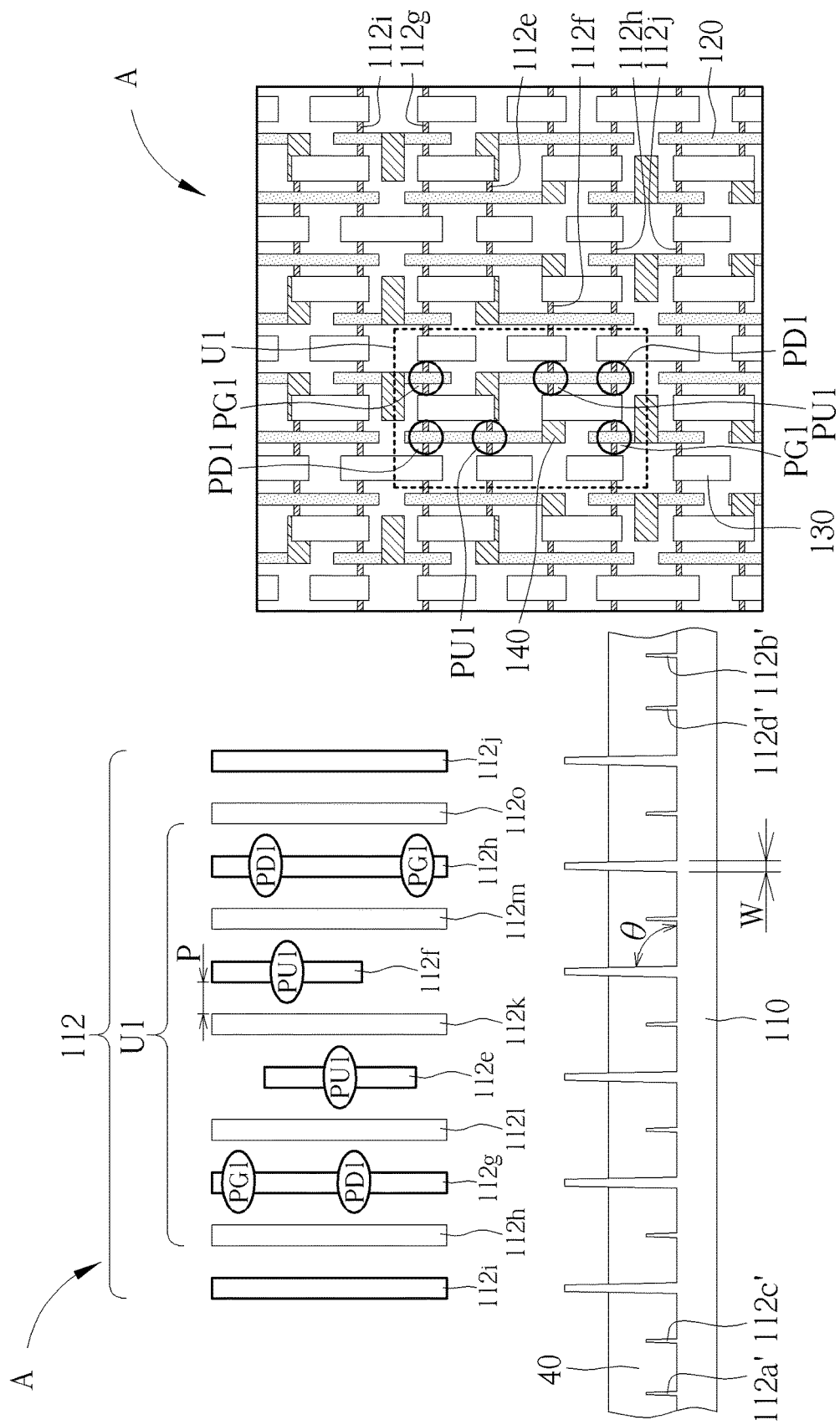
FIG. 7 schematically depict a top view and a cross-sectional view of a method of forming a static random-access memory (SRAM) cell array according to an embodiment of the present invention.
Figure 8:
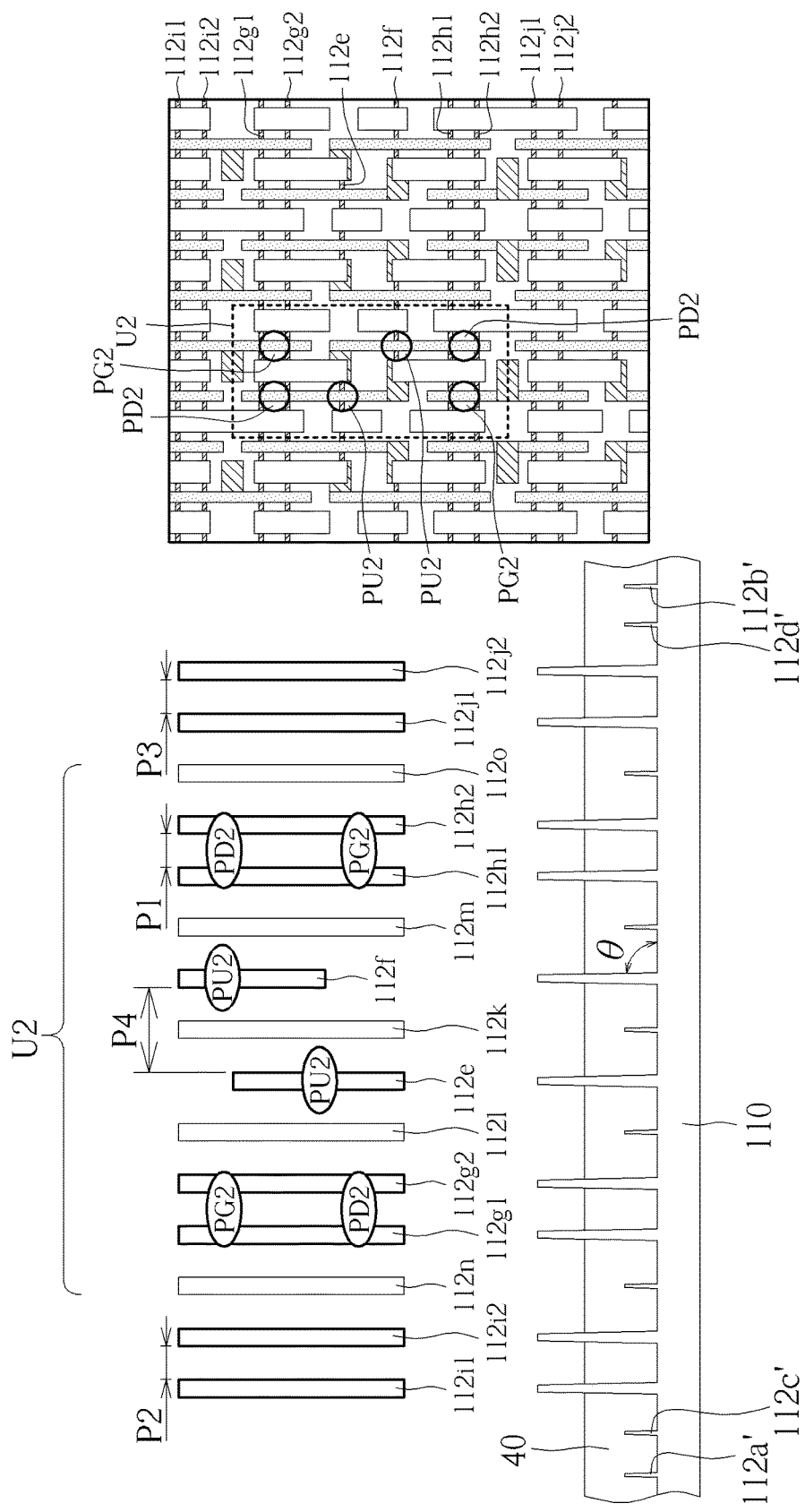
FIG. 8 schematically depict a top view and a cross-sectional view of a method of forming a static random-access memory (SRAM) cell array according to another embodiment of the present invention.

Two embodiments of forming a static random-access memory (SRAM) cell array are presented in the following. FIG. 7 depicts a (1,1,1) type static random-access memory (SRAM) cell array, wherein each pass-gate FinFET (PG FinFET) shares one single active fin with a corresponding pull-down FinFET (PD FinFET). FIG. 8 depicts a (1,2,2) type static random-access memory (SRAM) cell array, wherein each pass-gate FinFET (PG FinFET) shares two active fins with a corresponding pull-down FinFET (PD FinFET). Otherwise, the present invention can also be applied in other static random-access memory (SRAM) cell arrays, or other devices having fin structures.

After the step of performing second fin cut C2 as shown in FIG. 6, portions of the fin structures 112 are removed to forma fin structure layout used for transistors of a static random-access memory (SRAM) cell array formed thereon, as shown in FIG. 7. As shown in FIG. 6, the fin structures 112 may include a plurality of active fins 112e/112f/112g/112h/112i/112j and a plurality of dummy fins 112k'/112l'/112m'/112n'/112o'. A portion of the dummy fins 112k'/112l'/112m'/112n'/112o' is removed to obtain a fin structure layout with one same fin structure shape. In this embodiment, five dummy fins 112k/112l/112m/112n/112o are formed after the dummy fins 112k'/112l'/112m'/112n'/112o' are removed, wherein the dummy fins 112k/112l/112m/112n/112o protrude from the substrate 110 between the fin structures 112, as shown in the left diagram of FIG. 7, but it is not limited thereto. Thus, the layout of the active fins 112e/112f/112g/112h can constitute a (1,1,1) type static random-access memory (SRAM) cell U1. The active fins 112i/112j are located in both sides of the (1,1,1) type static random-access memory (SRAM) cell U1. The active fins 112i/112j maybe active fins of other static random-access memory (SRAM) cells. The five dummy fins 112k/112l/112m/112n/112o and the active fins 112e/112f/112g/112h/112i/112j are alternatively arranged. In this case, the dummy fins 112k/112l/112m/112n/112o and the active fins 112e/112f/112g/112h/112i/112j are alternatively arranged according to gaps of the active fins 112e/112f/112g/112h/112i/112j, so that the fin structures 112 can have same gaps with each other and same gaps as fin structures in other areas, but it is not limited thereto. For example, gaps between active fins in a logic area may be less than gaps between active fins in a (1,1,1) type static random-access memory (SRAM) cell U1 in current devices. Therefore, gaps between fin structures 112 can be equal to or approximately equal to gaps between active fins in a logic area by alternatively inserting the dummy fins 112k/112l/112m/112n/112o into the active fins 112e/112f/112g/112h/112i/112j.

By applying methods of the present invention, that inserts at least a dummy fin between active fins, gaps between fin structures of same areas or different areas can be common or approximately common, thereby the widths, profiles and shapes of the fin structures can be common or approximately common, and thus enhancing device performance such as reliability and stability. As the widths of the fin structures are different, the performance of a formed static random-access memory (SRAM) degrades; as the shapes of the fin structures are different, the processing stability degrades. Furthermore, a maximum gap of the fin structures must be less than twice of a minimum gap of the fin structures (otherwise a dummy fin can be inserted into the maximum gap). In this embodiment, only a static random-access memory cell area A is depicted and the static random-access memory (SRAM) cell U1 is disposed therein, but the substrate 110 may also include a logic area, and gaps of the fin structures 112 in the static random-access memory cell area A are preferably less than twice of gaps of the fin structures in the logic area. Otherwise, as gaps between the fin structures 112 in the static random-access memory cell area A are larger than or equal to twice of gaps between fin structures in the logic area, at least a dummy fin can be inserted into gaps between the fin structures 112, so that the widths, shapes and profiles of the fin structures 112 in the static random-access memory cell area U1 and the widths, shapes and profiles of the fin structures in the logic area can be the same or proximately the same.

The (1,1,1)-type static random-access memory (SRAM) cell U1 includes two pull-up FinFETs PU1, two pass-gate FinFETs PG1 and two pull-down FinFETs PD1. Each pass-gate FinFET PG1 shares only one single active fin 112h/112g with a corresponding pull-down FinFET PD1, and one single dummy fin 112k is inserted between the two active fins 112e/112f with two adjacent pull-up FinFETs PU1 disposed thereon. In a preferred embodiment, gaps P of the fin structures 112 are common. Likewise, the dummy fin 112l/112m is disposed between the shared active fins 112h/112g and one of the active fins 112f/112e of the two adjacent pull-up FinFETs PU1 nearest to the shared active fins 112h/112g. The dummy fins 112o/112h are respectively disposed between the shared active fins in two adjacent memory cells, meaning between the active fins 112h/112j and between the active fins 112g/112i.

It is emphasized that, the gaps P between fin structures 112 affect the widths w and shapes of the fin structures 112. As the gaps P of the fin structures 112 are large, the slopes of cross-sectional profiles of the fin structures 112 are large, meaning the angle θ is larger; as the gaps P of the fin structures 112 are reduced, the slopes of cross-sectional profiles of the fin structures 112 are reduced, meaning the angle θ is reduced. Therefore, as the gaps between the fin structures 112 are different, the widths and the slopes of cross-sectional profiles of the fin structures 112 are different. As the widths and the slopes of cross-sectional profiles of the fin structures 112 are non-uniform, the reliability and stability of a formed device degrades. In this embodiment, dummy fins 112k/112l/112m/112n/112o are alternatively inserted into the active fins 112e/112f/112g/112h/112i/112j to adjust gaps P between the fin structures 112, enabling gaps P between the fin structures 112 and gaps P between the fin structures 112 and fin structures of other areas such as logic areas being the same. In this embodiment, only one single dummy fin 112k/112l/112m/112n/112o is inserted alternatively into the active fins 112e/112f/112g/112h/112i/112j, but it is not limited thereto. The numbers of the dummy fins 112k/112l/112m/112n/112o may be optionally inserted into the active fins 112e/112f/112g/112h/112i/112j, or two or more than two dummy fins 112k/112l/112m/112n/112o may be inserted into adjacent active fins 112e/112f/112g/112h/112i/112j, depending upon the gaps between the fin structures 112 and gaps between the fin structures 112 and fins structures in different areas.

The (1,1,1)-type static random-access memory (SRAM) cell U1 may also include gate electrodes 120 over the fin structures 112, metal interconnections 130 connecting each transistor including the pass-gate FinFETs PG1, the pull-down FinFETs PD1 and the pull-up FinFETs PU1, and the contact plugs 140 physically connecting the gate electrodes 120 and the metal interconnections 130. The structure of a (1,1,1)-type static random-access memory (SRAM) cell and operating methods are known in the art and are not described herein.

The present invention may be applied in a (1,2,2)-type static random-access memory (SRAM) cell array, as shown in FIG. 8. The difference between the (1,2,2)-type static random-access memory (SRAM) cell U2 and the (1,1,1)-type static random-access memory (SRAM) cell U1 is that: the active fin 112h is replaced with two active fins 112h1/

112h2, and a pass-gate FinFET PG2 in the (1,2,2)-type static random-access memory (SRAM) cell U2 shares the two active fins 112h1/112h2 with a corresponding pull-down FinFET PD2; the active fin 112g is replaced with two active fins 112g1/112g2, and the other pass-gate FinFET PG2 in the (1,2,2)-type static random-access memory (SRAM) cell U2 shares the two active fins 112g1/112g2 with a corresponding pull-down FinFET PD2. The active fin 112i beside the (1,1,1)-type static random-access memory (SRAM) cell U1 is replaced with two active fins 112i1/112i2, and the active fin 112j beside the (1,1,1)-type static random-access memory (SRAM) cell U1 is replaced with two active fins 112j1/112j2. Still only one single dummy fin 112k is disposed between the active fins 112e/112f of the adjacent pull-up FinFETs PU2.

Since a gap P1 between the two active fins 112h1/112h2, a gap P2 between the two active fins 112i1/112i2 and a gap P3 between the two active fins 112j1/112j2 are less than gaps P4 between the other active fins, the dummy fins 112k/112l/112m/112n/112o are disposed between active fins except for the two active fins 112h1/112h2, the two active fins 112i1/112i2 and the two active fins 112j1/112j2. Thereby, gaps between fin structures 112 can be adjusted to be as common as possible. In this way, the widths and the shapes of the fin structures 112 can be the same, and thus improves processing reliability and enhancing performance of a formed static random-access memory (SRAM) array.

After the active fins 112e/112f/112g(112g1/112g2)/112h (112h1/112h2)/112i(112i1/112i2)/112j(112j1/112j2) and the dummy fins 112k/112l/112m/112n/112o are formed, isolation structures 40 can be formed between the active fins 112e/112f/112g(112g1/112g2)/112h(112h1/112h2)/112i (112i1/112i2)/112j(112j1/112j2), wherein the active fins 112e/112f/112g(112g1/112g2)/112h(112h1/112h2)/112i (112i1/112i2)/112j (112j1/112j2) protrude from the isolation structures 40, but the isolation structures 40 blanketly cover the dummy fins 112k/112l/112m/112n/112o.

To summarize, the present invention provides a static random-access memory (SRAM) cell array and forming method thereof, which patterns a substrate and forms a plurality of fin structures, wherein the fin structures include a plurality of active fins and a plurality of dummy fins, and then removes at least a portion of the dummy fins. Thereby, gaps between fin structures can be common or approximately common by inserting dummy fins into active fins, so that the widths and shapes of the fin structures can be the same. Due to the widths and shapes of the fin structures of the present invention being the same, processing stability and device reliability can be improved.

More precisely, a formed static random-access memory (SRAM) cell array of the present invention may include two pull-up FinFETs, two pass-gate FinFETs and two pull-down FinFETs. Each pass-gate FinFET (PG FinFET) shares at least one active fin with a corresponding pull-down FinFET (PD FinFET). For instance, a (1,1,1)-type static random-access memory (SRAM) cell array of the present invention includes each of the pass-gate FinFETs (PG FinFET) sharing only one active fin structure with a corresponding pull-down FinFET (PD FinFET); a (1,2,2)-type static random-access memory (SRAM)cell array of the present invention includes each of the pass-gate FinFETs (PG FinFET) shares only two active fins with a corresponding pull-down FinFET (PD FinFET). It is emphasized that, at least one of the dummy fins is disposed between the active fins of the two adjacent pull-up FinFETs in a static random-access memory, thereby the two active fins of the two adjacent pull-up FinFETs currently having larger gaps than the other active fins can have gaps approximately common to gaps between the other active fins in the static random-access memory (SRAM) cell or gaps between fin structures in a same area or other areas such as a logic area. By applying the present invention, a maximum gap of the fin structures is less than twice of a minimum gap of the fin structures (otherwise a dummy fin can be inserted into the maximum gap).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A static random-access memory (SRAM) cell array, comprising:
   a plurality of fin structures located on a substrate, the fin structures comprise a plurality of active fins and a plurality of remaining dummy fins surrounded by a plurality of isolation structures, wherein each pass-gate FinFET (PG FinFET) shares two of the active fin structures with a corresponding pull-down FinFET (PD FinFET), and each pull-up FinFET (PU FinFET) is disposed over one single active fin in a static random-access memory cell.

2. The static random-access memory (SRAM) cell array according to claim 1, wherein each of the static random-access memory cells comprises two pull-up FinFETs, two pass-gate FinFETs and two pull-down FinFETs.

3. The static random-access memory (SRAM) cell array according to claim 2, further comprising:
   at least one of the dummy fins disposed between one of the shared active fins and one of the active fins of the two adjacent pull-up FinFETs nearest to the shared active fin.

4. The static random-access memory (SRAM) cell array according to claim 1, further comprising:
   at least one of the dummy fins disposed between the shared active fins in two adjacent static random-access memory cells.

5. The static random-access memory (SRAM) cell array according to claim 1, wherein the plurality of isolation structures are located between the active fins and blanketly covering the remaining dummy fins.

6. The static random-access memory (SRAM) cell array according to claim 1, wherein a maximum gap of the fin structures is less than twice of a minimum gap of the fin structures.

7. The static random-access memory (SRAM) cell array according to claim 1, wherein the substrate comprises a static random-access memory cell area having the static random-access memory (SRAM) cell array located therein, and a logic area, wherein gaps of the fin structures in the static random-access memory cell area are less than twice of gaps of the fin structures in the logic area.

8. The static random-access memory (SRAM) cell array according to claim 7, wherein the profiles of the fin structures in the static random-access memory cell area are common to the profiles of the fin structures in the logic area.

* * * * *